US006724032B2

(12) United States Patent
Chindalore et al.

(10) Patent No.: US 6,724,032 B2
(45) Date of Patent: Apr. 20, 2004

(54) MULTI-BIT NON-VOLATILE MEMORY CELL AND METHOD THEREFOR

(75) Inventors: Gowrishankar L. Chindalore, Austin, TX (US); James D. Burnett, Austin, TX (US); Alexander B. Hoefler, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/202,697

(22) Filed: Jul. 25, 2002

(65) Prior Publication Data

US 2004/0016950 A1 Jan. 29, 2004

(51) Int. Cl.[7] ............................................. H01L 27/108
(52) U.S. Cl. ..................... 257/304; 257/315; 257/316; 257/321; 257/345
(58) Field of Search ........................... 257/315, 316, 257/321, 345

(56) References Cited

U.S. PATENT DOCUMENTS 5,021,999 A * 6/1991 Kohda et al. .......... 365/185.03
5,627,392 A * 5/1997 Diorio et al. ............... 257/315

OTHER PUBLICATIONS

Yoshikawa, "Embedded Flash Memories—Technology Assessment and Future—," VLSI Symposium, pp. 183–186 (1999).

* cited by examiner

Primary Examiner—Son Mai
Assistant Examiner—Mai-Huong Tran
(74) Attorney, Agent, or Firm—James L. Clingan, Jr.; Robert L. King

(57) ABSTRACT

A non-volatile multiple bit memory (10, 50) has electrically isolated storage elements (17, 21, 78, 80) that overlie a channel region having a central area (24, 94) with high impurity concentration. A planar gate (30, 84) overlies the storage elements. The high impurity concentration may be formed by a centrally located region (24) or by two peripheral regions (70, 72) having lower impurity concentration than the central portion of the channel. During a read or program operation, the channel area of high impurity concentration effectively controls a channel depletion region to enhance reading or programming of stored data bits. During a hot carrier program operation, the channel area of high impurity concentration enhances the programming efficiency by decreasing leakage currents in a memory array.

19 Claims, 4 Drawing Sheets

MULTI-BIT NON-VOLATILE MEMORY CELL AND METHOD THEREFOR

FIELD OF THE INVENTION

The invention relates to non-volatile memories, and more particularly to non-volatile memory cells having more than one bit.

RELATED ART

Multi-bit memory cells are typically formed by having a nitride storage layer that is programmed with electrons near the source/drains (current electrodes) of a transistor. There are thus two storage regions in the nitride, one near each source/drain. These storage regions receive electrons typically by hot carrier injection (HCI). First one of the source/drains is operated as the drain and the other as the source. Current flowing generates sufficiently hot electrons near the drain so that electrons collect in the storage region in the nitride near the source/drain being operated as the drain. The other of the storage regions is programmed in similar fashion, operating it as the drain.

The state of each storage region can be read separately. One of the source/drains has a voltage applied thereto, which causes depletion of the channel near it, and thus masks the influence of the storage region near the source/drain region that is being operated as the drain. Thus, the logic state of the storage region near the drain is irrelevant because the channel that is influenced by that storage region is depleted anyway. Thus, influence of the state of the other storage region can be isolated from the influence of the storage region near the drain. The primary advantage of this two state cell is higher density.

Many problems have also arisen, however. Reliability has become a significant problem due to the difficulty in keeping the electrons from moving out of the nitride storage regions where they were originally injected. Another is that the depletion region can extend so far as to reduce the portion of the channel under the influence of the storage region to be read to too low of an amount to be able to be reliably read.

Accordingly, there is a need for a multi-bit memory cell having increased reliability.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A memory device has two high reliability bits that are achieved with two storage elements over a single channel. The storage elements are separated by a highly insulative material so that carriers are greatly impeded from moving between the two storage elements. The channel has three portions. Two portions are under respective storage elements and have a relatively low net doping of a first conductivity type. The third portion is between the first two portions and has a higher net doping of the first conductivity type. This third portion greatly impedes the extension of the depletion region due to drain bias. This is better understood with reference to the following description of the drawings.

Figure 1:
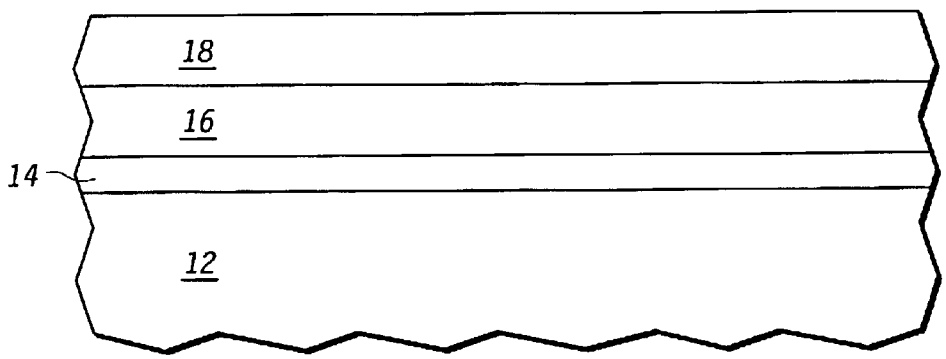
FIGS. 1–6 are cross sections of a memory cell in consecutive stages of manufacture according a first embodiment of the invention.

Shown in FIG. 1 is a device 10 comprising a substrate 12, an insulating layer 14, a storage layer 16, and an insulating layer 18. Storage layer 16 is preferably nitride, oxynitride, or polysilicon but may be another material suitable for storing charge. Insulating layer 18 is preferably oxide for the case in which storage layer 16 is nitride or oxynitride and preferably an oxide-nitride-oxide (ONO) stack for the case in which storage layer 16 is polysilicon. Insulating layer 14 is preferably oxide but may be another appropriate insulating material such as a high K dielectric such as hafnium oxide. Generally, it is desirable that insulating layer 14 have a higher band gap than that of storage layer 16. Substrate 12 is preferably silicon doped to P− but could be another material as well as conductivity type. Also substrate 12 may be an semiconductor-on-insulator (SOI) substrate.

Figure 2:
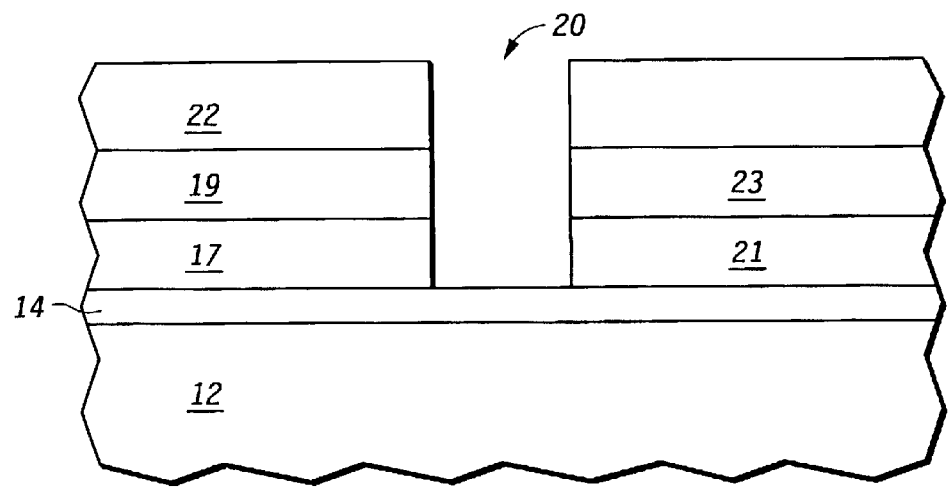

Shown in FIG. 2 is device 10 after an etch of insulating layer 18 and storage layer 16 to form an opening 20 to insulating layer 14. This is achieved by depositing a photoresist layer 22, patterning photoresist layer 22 to leave an opening in photoresist layer 22, then etching insulating layer 18 and storage layer 16 to leave insulators 19 and 23 from insulating layer 18 and storage elements 17 and 21 from storage layer 16.

Figure 3:
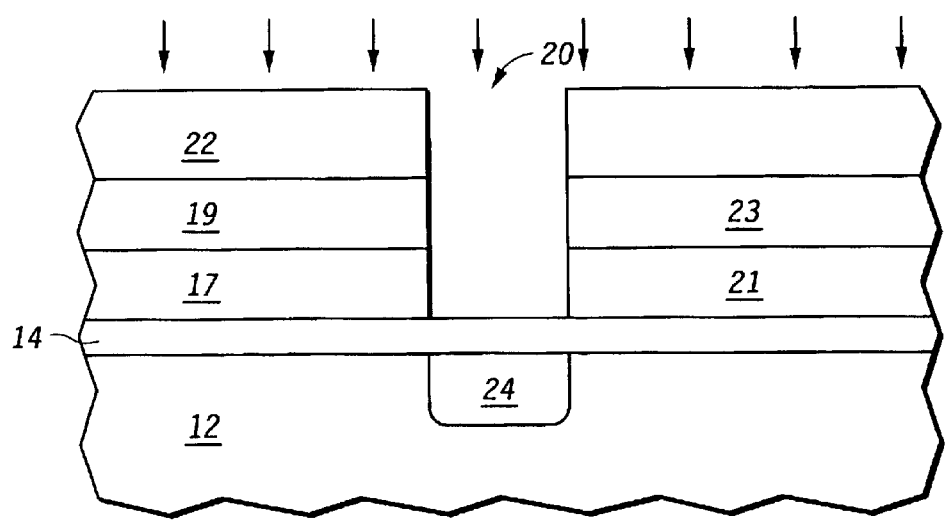

Shown in FIG. 3 is device 10 after an implant of P-type material, preferably boron. Indium is one alternative to boron doping. Photoresist is used as a mask so that a region 24 of P type material is formed below opening 20. Region 20 is the same conductivity type as the semiconductor material immediately laterally adjacent to it but of a higher net concentration of that type.

Figure 4:
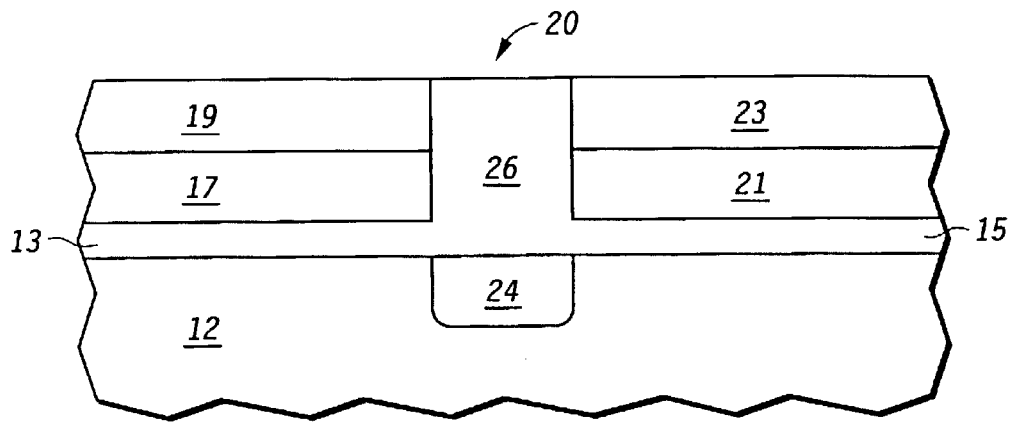

Shown in FIG. 4 is device 10 after photoresist 22 has been removed and opening 20 has been filled with a relatively high quality insulator fill 26, such as oxide. Insulator fill 26 may be conveniently grown as an oxide. This is effective in filling opening 20 because insulators 19 and 23, either as an oxide or an ONO stack, will grow only slightly. Although it is desirable for insulator fill 26 to be planar with insulators 19 and 23, adequate planarity is achieved even if it does not quite completely fills opening 20 or extends somewhat above insulators 19 and 23. The thickness of insulator fill 26 can be controlled by a combination of growth and deposit as well as etch back to achieve any other desired characteristic of insulator fill 26. In the preferred approach insulating layer 14 and insulator fill 26 are the same material, oxide, but that is not necessary. A portion 13 of insulator layer 14 is shown as being under storage region 17, and a portion 15 of insulator 14 is shown as being under storage region 21.

As an alternative for the nitride storage element case, insulators 19 and 23 may be formed as part of the formation of insulator fill 26. In such case, device 10 of FIG. 1 would not have insulating layer 18 and FIGS. 2 and 3 would not have insulators 19 and 23.

Figure 5:
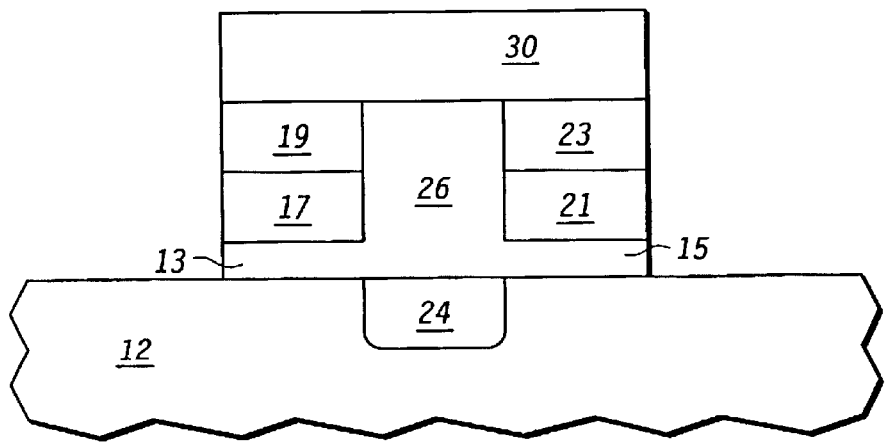

Shown in FIG. 5 is device 10 after formation of a control gate 30, which is preferably polysilicon but can be another material suitable as a control gate. Metal gates, such as titanium nitride, may become more desirable for such purpose. Polysilicon is deposited then etched to leave control gate 30. The etch of control gate 30 is extended to insulators 19 and 23 and storage regions 17 and 21 to achieve their final shapes. To the extent possible, control gate 30 is centered about region 24.

Figure 6:
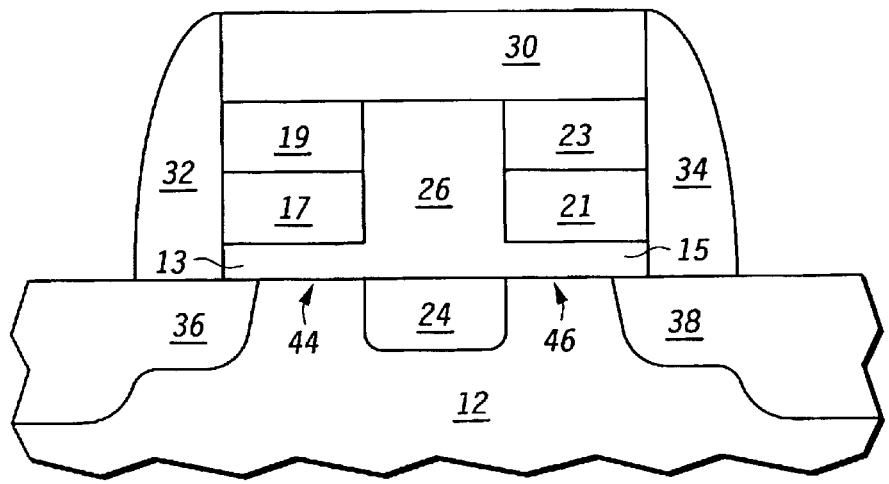

Shown in FIG. 6 is device 10 after formation of source/drain regions 36 and 38 and sidewall spacers 32 and 34. Source/drains 36 and 38 are formed by implanting arsenic into substrate 12 using control gate 30 as a mask, forming sidewall spacers 32 and 34, and then implanting arsenic using sidewall spacers 32 and 34 as a mask. The result is a completed two-bit memory cell having a channel comprising region 24, region 44, and region 46. Regions 44 and 46 have retained the same type and concentration as substrate 12, which is a lower net concentration than region 24. Thus, device 10 of FIG. 6 has a channel with two regions of relatively low net doping concentrations and a region of higher net doping concentration with the region of higher concentration located between the regions of lower concentration. Regions 44 and 46, the lower concentration regions, are directly under storage regions 17 and 21, respectively.

Preferable dimensions for the case in which the storage regions are nitride follow. Other dimensions can also be effective to achieve results as desired. These dimensions are considered plus or minus 20%. Insulating regions 13 and 15 are 50 Angstroms. Storage regions 17 and 21 are 60 Angstroms thick. Insulating regions 19 and 23 are 50 Angstroms. Insulating fill 26 is 160 Angstroms thick. The channel length is 0.24 Micron. The length of regions 44 and 46 is 0.07 micron each. The length of region 24 is 0.1 micron. Substrate 12 and Regions 44 and 46 have a net doping of $5 \times 10^{16}$ per cm$^3$, and region 24 has a net doping of $5 \times 10^{17}$. Source/drains 90 and 92 have doping concentrations of $1 \times 10^{19}$ and $1 \times 10^{20}$ for the lightly doped and heavily doped portions, respectively.

Storage regions 17 and 21 may be individually programmed using hot carrier injection. To program region 17, source/drain 36 is treated as the drain so that a relatively higher voltage is applied to source/drain region 36 and current flows from source/drain region 36 to source/drain region 38. This current flow results in hot electrons being injected into storage region 17. Similarly, storage region 21 is programmed by treating source/drain region 38 as the drain, flowing current from source/drain 38 to source/drain 36, and injecting hot electrons into storage region 21. The logic states of storage regions 17 and 21 are read in a similar manner. To read storage region 17, source/drain region 38 is treated as the drain by applying a relatively higher voltage thereto. This has the effect of depleting region 46 in the channel and thus masking the effect of storage region 21 on the channel. Region 24, with its relatively higher concentration, prevents the depletion region from extending to region 44 of the channel. A sufficiently high voltage is applied to control gate 30 to invert the surface of region 24. Storage region 17 is programmed to contain sufficient electrons so that when it is programmed it will prevent the inversion of region 44 at the needed control gate voltage to invert the surface region 24.

Figure 7:
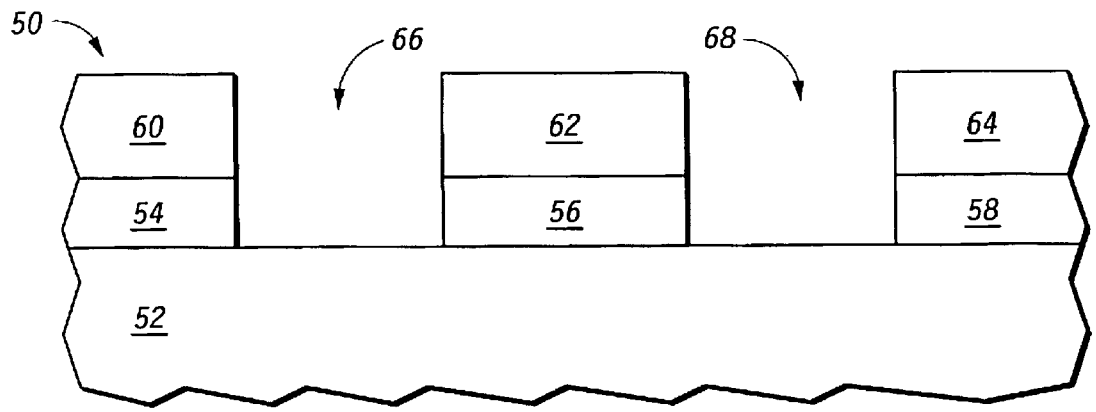
FIGS. 7–10 are cross sections of a memory cell in consecutive stages of manufacture according a second embodiment of the invention.

Shown in FIG. 7 is a device 50 comprising substrate 52, insulating portions 54, 56, and 58 on a surface of substrate 52, and photoresist portions 60, 62, and 64 overlying insulating portions 54, 56, and 58, respectively. Substrate is preferably silicon that is P but may be another semiconductor material and/or type. The insulating portions are preferably oxide but may be other materials such as high k dielectrics as, for example, hafnium oxide. The result shown in FIG. 7 is achieved by depositing an insulating layer, overlying the insulating layer with photoresist, patterning the photoresist, then etching the insulating layer according to the pattern to leave insulating portions 54, 56, and 58. An opening 66 is between insulating portions 54 and 56. An opening 68 is between insulating portions 56 and 58.

Figure 8:
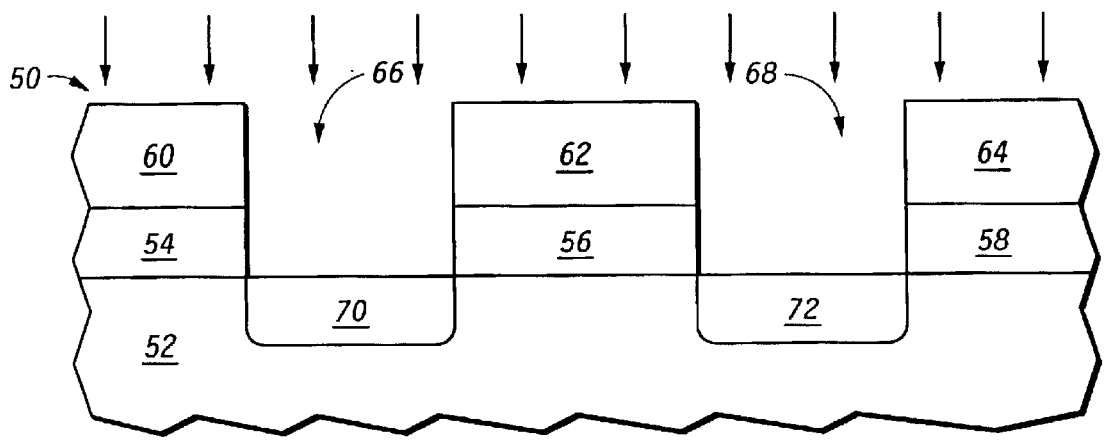

Shown in FIG. 8 is device 50 after an implant of an N type dopant, preferably phosphorus, but could another dopant such as arsenic. The result of the implant is the formation of regions 70 and 72 in substrate 52 at openings 66 and 68 respectively. Regions 70 and 72, having been formed by counterdoping two portions of the substrate, have a net doping concentration that is less than the substrate. These regions can be considered to be P−. The implant is sufficiently light so as to not convert the regions 70 and 72 to the opposite type, N in this case. The light implant reduces the net doping concentration of P-type to a level that is lower than that of the substrate 52.

Figure 9:
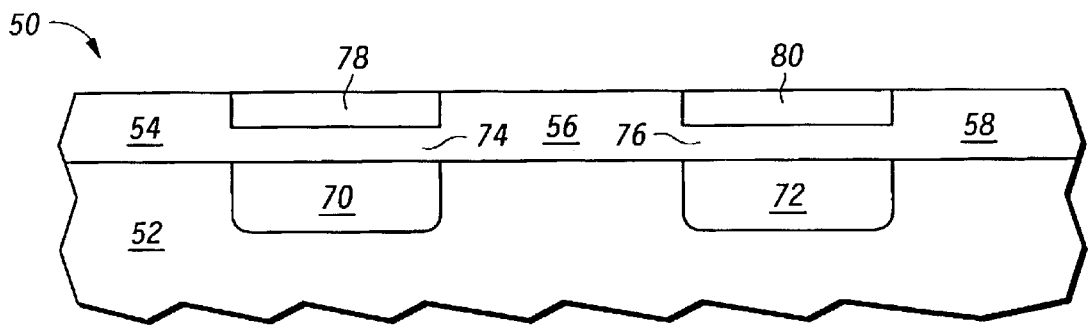

Shown in FIG. 9 is device 50 after photoresist portions 60, 62, and 64 have been removed, insulator portions 74 and 76 have been grown in openings 66 and 68, respectively, and storage regions 78 and 80 have been formed over insulator portions 66 and 68, respectively. Insulator portions 74 and 76 are preferably grown in the same manner as insulators portions 54, 56, and 58 were grown. Storage regions 78 and 80 may be either nitride or polysilicon. In either case, preferably a film of the desired material is deposited over the entire surface and then etched back, preferably by chemical mechanical polishing (CMP). The result is that storage regions 78 and 80 are planar with insulating portions 54, 56, and 58.

Figure 10:
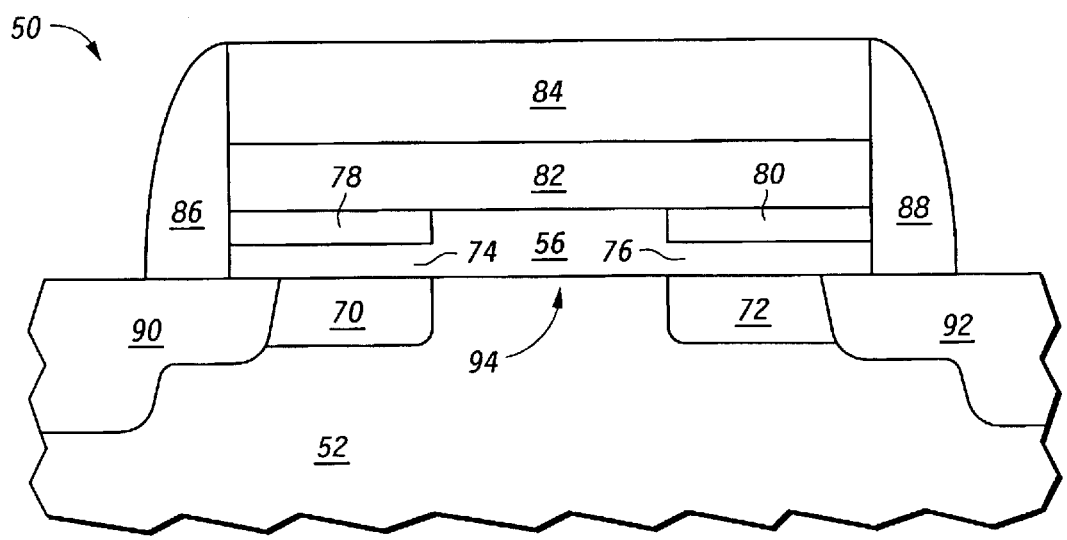

Shown in FIG. 10 is device 10 after formation of control electrode 84, sidewall spacers 86 and 88, and source/drain regions 90 and 92. Control electrode is formed, preferably of polysilicon, by depositing a film suitable for a control gate then etching it to the desired shape for the control gate. After formation of control gate 84, source/drain regions 90 and 92 are formed. An implant is made using control gate 84 as a mask, sidewall spacers 86 and 88 are formed, and another implant is performed using sidewall spacers 86 and 88 as a mask to achieve the final doping of source/drain regions 90 and 92. There is thus a channel under control electrode 84 comprising regions 70 and 72 and a region 94 that is a portion of the substrate between regions 70 and 72. Region 72 is under storage region 80. Region 70 is under storage region 78. Insulating portion 56 separates storage regions 78 and 80 so that charge is prevented from passing between storage regions 78 and 80.

Preferable dimensions for the case in which the storage regions are nitride follow. Other dimensions can also be effective to achieve results as desired. These dimensions are considered plus or minus 20%. Insulating regions 74 and 76 are 70 Angstroms. Storage regions 78 and 80 are 80 Angstroms. Insulating layer is 82 is 50 Angstroms. Control electrode 84 is 1000 Angstroms. The channel length is 0.24 microns. The length of doped regions 70 and 72 is 0.07 micron and the length of region 94 is 0.1 micron. Regions 70 and 72 have a net doping of $5 \times 10^{16}$ per cm$^3$, and substrate 52 and region 94 have a net doping of $5 \times 10^{17}$. Source/drains 90 and 92 have doping concentrations of $1 \times 10^{19}$ and $1 \times 10^{20}$ for the lightly doped and heavily doped portions, respectively.

The resulting structure of FIG. 10 is a two-bit memory cell very similar to that shown in FIG. 6. In both cases the channel has a region of a relatively higher net doping concentration between two regions of relatively lower net doping concentration. In both cases the regions of lower net doping concentration are aligned under storage regions. In both cases the storage regions are separated from each other by an insulating region that is effective in preventing charge transfer between the storage regions. The programming and reading are achieved in the same manner for both two-bit memory cells.

A benefit of insulating region 26 and insulating fill 56 is that it allows for a bulk erase of an array of memory cells of this type using Fowler-Nordheim tunneling. This can be achieved by applying a relatively large negative voltage to control gate 30 and 84 while grounding the substrate. This will have the effect of driving electrons out of storage regions 19, 23, 78, and 80. There is no selectivity required to achieve this electron removal. If storage regions 19, 23, 78, and 80 were continuous nitride this bulk erase would be effective but would result in depleting the portion of the nitride between the storage regions. Such depletion cannot be corrected. As this depletion continues, this portion of the nitride could actually cause that portion of the channel that it overlies to become inverted even when the gate is grounded. In a typical memory array, however, cells in which both bits are erased, the low electron condition, should be nonconductive even when the gate is grounded which is typical of the way that a memory cell is unselected. The depletion of the nitride between the storage elements that would occur after tunnel erase, however, would have the effect of having large leakage currents in the array during read and programming. This is not an acceptable result for users of such memories.

Another benefit of separating the storage regions with an insulating region is that there is less concern about forcing the injection to occur at the edge of the source/drain regions. This very tightly controlled electron injection point is achieved with a high gate voltage. With the storage regions separated, the injection point does not need to be so tightly controlled and thus the gate voltage during programming may be reduced. This separation allows for a reduction in the thickness of insulating regions such as insulating region 82 of FIG. 10 and regions 19 and 23 of FIG. 6. Further, the voltages that need to be generated are lower and that results in a reduction in the size of the transistors, in the periphery, that are required to generate and control these higher voltages.

A benefit of the region in the middle of the channel with the relatively high net concentration is that the threshold voltage of the memory cell can be set to a desirable point. The concentration of this region can be selected and thus the threshold voltage selected. It must be sufficiently below that caused by the high electron concentration state of a storage location to provide a desirable margin. With that constraint, the threshold voltage is adjustable to a level that is desirable for other circuit operation considerations. The threshold voltage can be raised to reduce leakage. Leakage can be not just a waste of power but can also cause problems with reading and programming. On the other hand the threshold voltage can be lowered to improve speed of sensing or to reduce the gate voltage during read to reduce problems with read disturb.

In the foregoing specification, the invention has been described with reference to specific embodiments. However, one of ordinary skill in the art appreciates that various modifications and changes can be made without departing from the scope of the present invention as set forth in the claims below. For example, the conductivity types of the substrate, the source/drains, and the other doped regions can be reversed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory cell comprising:
   a substrate;
   a first storage element overlying a first portion of the substrate for storing a first data bit in the memory cell;
   a second storage element overlying a second portion of the substrate insulating layer for storing a second data bit in the memory cell;
   an insulator electrically separating the first storage element from the second storage element, the insulator comprising a material that is different from the first and second storage element;
   a control electrode overlying the first storage element and the second storage element, the control electrode having a substantially planar lower surface and a substantially planar upper surface; and
   first and second current electrodes formed in the substrate, a portion of each of the first and second current electrodes respectively underlying a portion of the first storage element and the second storage element.

2. The memory cell of claim 1 further comprising:
   a channel region separating the first and second current electrodes wherein the channel region has a central area of substantially higher impurity concentration than adjacent areas of the channel region.

3. The memory cell of claim 2 wherein the central area of the channel region further comprises a doped region of higher net doping concentration than the adjacent areas of the channel region.

4. The memory cell of claim 2 wherein the channel region further comprises first and second doped regions in the adjacent areas, the first and second doped regions having a net impurity concentration that is lower than the central area of the channel region.

5. The memory cell of claim 1 further comprising:
   an insulating layer overlying the substrate for electrically isolating the first storage element and the second storage element from the substrate.

6. The memory cell of claim 1 further comprising:
   an insulating layer overlying the first storage element and the second storage element for electrically isolating the control electrode from first storage element and the second storage element.

7. A memory cell comprising:
   a substrate;
   a first insulator overlying a first portion of the substrate;
   a second insulator overlying a second portion of the substrate;
   a first storage element overlying the first insulator for storing a first data bit;
   a second storage element overlying the second insulator for storing a second data bit;

a third insulator overlying the first storage element;

a fourth insulator overlying the second storage element;

a fifth insulator having a material different from the first storage element and the second storage element and interposed between the first storage element and the second storage element;

a control electrode overlying the third insulator, the fourth insulator and the fifth insulator;

first and second current electrodes formed in the substrate and separated by a channel region; and a region of net higher impurity concentration from other areas of the channel region and formed in the channel underlying the fifth insulator, the region of net higher impurity concentration limiting a depletion region within the channel when either of the first storage element and the second storage element of the memory cell is read or programmed.

8. The memory cell of claim 7 wherein the first storage element and the second storage element comprise either a nitride or polysilicon and the fifth insulator comprises an oxide.

9. The memory cell of claim 7 wherein the third insulator and the fourth insulator each comprise a multiple-layer insulator having multiple materials.

10. A memory cell comprising:

a substrate;

a first insulator overlying a first portion of the substrate;

a second insulator overlying a second portion of the substrate;

a first storage element overlying the first insulator for storing a first data bit;

a second storage element overlying the second insulator for storing a second data bit;

a third insulator interposed between the first storage element and the second storage element and having a material composition that differs from that of the first storage element and the second storage element to electrically isolate the first storage element from the second storage element;

a fourth insulator overlying the first storage element, the second storage element and the third insulator;

a control electrode overlying the fourth insulator;

a first current electrode and a second current electrode formed in the substrate and separated by a channel region;

a first region formed within the channel having net lower impurity concentration than a central portion of the channel underlying the third insulator; and a second region formed within the channel also having net lower impurity concentration than the central portion of the channel underlying the third insulator.

11. The memory cell of claim 10 wherein the first region is further formed within the first portion of the substrate and the second region is further formed within the second portion of the substrate.

12. The memory cell of claim 10 wherein the first region is further formed in contact with the first current electrode and the second region is further formed in contact with the second current electrode.

13. The memory cell of claim 10 wherein the first storage element and the second storage element comprise either a nitride or polysilicon and the third insulator comprises an oxide.

14. The memory cell of claim 10 wherein the fourth insulator further comprises a multiple-layer insulator having multiple materials.

15. A multiple-bit memory cell comprising:

a substrate having a first portion and a second portion;

a first storage element overlying the first portion of the substrate for storing a first data bit in the memory cell;

a second storage element overlying the second portion of the substrate for storing a second data bit in the memory cell;

an insulator electrically separating the first storage element from the second storage element, the insulator comprising a material that is different from the first storage element and the second storage element;

a control electrode overlying the first storage element, the second storage element and the insulator;

a first current electrode and a second current electrode formed in the substrate, a portion of each of the first current electrode and the second current electrode respectively underlying a portion of the first storage element and the second storage element, the first current electrode and the second current electrode forming a channel region; and a region within the channel having net higher impurity concentration than other areas of the channel and formed underlying the insulator, the region functioning to restrict a depletion region created when either of the first storage element and the second storage element of the multiple-bit memory cell is read or programmed.

16. The multiple-bit memory cell of claim 15 wherein the region within the channel having net higher impurity concentration comprises a highly doped region formed in a central area of the channel.

17. The multiple-bit memory cell of claim 15 wherein the region within the channel having net higher impurity concentration comprises a first region of lower net impurity concentration adjacent the first current electrode and a second region of lower net impurity concentration adjacent the second current electrode wherein a central portion of the channel region becomes the region within the channel having net higher impurity concentration.

18. The multiple-bit memory cell of claim 15 further comprising:

an insulating layer overlying the substrate for electrically isolating the substrate from the first storage element and the second storage element.

19. The multiple-bit memory cell of claim 15 further comprising:

an insulating layer overlying the first storage element and the second storage element for electrically isolating the first storage element and the second storage element from the control electrode.

* * * * *